US010705585B2

(12) United States Patent
Chandra et al.

(10) Patent No.: US 10,705,585 B2
(45) Date of Patent: Jul. 7, 2020

(54) BATTERY CHARGE LEAKAGE MONITOR

(71) Applicant: Microsoft Technology Licensing, LLC, Redmond, WA (US)

(72) Inventors: Sachin Ramesh Chandra, Kirkland, WA (US); Gung Moon Chan, Newcastle, WA (US); Vinod Chakravarthy, Redmond, WA (US); Brian D. Hahn, Bellevue, WA (US); Da Hai Hu, Redmond, WA (US); Brett A. Muzzey, Seattle, WA (US); Gary Alan Tornquist, Sammamish, WA (US); Rajagopal K. Venkatachalam, Woodinville, WA (US); Ceceli Wilhelmi, Burien, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 186 days.

(21) Appl. No.: 15/942,140

(22) Filed: Mar. 30, 2018

(65) Prior Publication Data

US 2019/0302863 A1    Oct. 3, 2019

(51) Int. Cl.
| G06F 1/28 | (2006.01) |
| G01R 31/36 | (2020.01) |
| H02J 7/00 | (2006.01) |
| G06F 1/3234 | (2019.01) |
| G06F 1/329 | (2019.01) |
| G06F 1/30 | (2006.01) |
| G06F 1/3212 | (2019.01) |
| G06F 1/3287 | (2019.01) |
| G06F 1/3296 | (2019.01) |
| G06F 1/26 | (2006.01) |

(52) U.S. Cl.
CPC .......... *G06F 1/28* (2013.01); *G01R 31/3648* (2013.01); *G06F 1/263* (2013.01); *G06F 1/305* (2013.01); *G06F 1/329* (2013.01); *G06F 1/3212* (2013.01); *G06F 1/3278* (2013.01); *G06F 1/3287* (2013.01); *G06F 1/3296* (2013.01); *H02J 7/0068* (2013.01); *G01R 31/36* (2013.01); *H02J 7/0047* (2013.01); *H02J 7/0048* (2020.01)

(58) Field of Classification Search
CPC .. G01R 31/36; G01R 31/024; G01R 31/3648; H01M 10/04; H01M 10/4285; H01M 10/48; H02J 7/0047; H02J 7/0048; H02J 7/0068; G06F 1/263; G06F 1/28; G06F 1/305; G06F 1/3212; G06F 1/3278; G06F 1/3287; G06F 1/329
See application file for complete search history.

(56) References Cited

U.S. PATENT DOCUMENTS 5,796,239 A    8/1998    Van Phuoc et al.
5,994,876 A    11/1999    Canny et al.
(Continued)

*Primary Examiner* — Terrell S Johnson
(74) *Attorney, Agent, or Firm* — Holzer Patel Drennan

(57) ABSTRACT

A system for battery current monitoring includes a system power throttle stored in memory and executable by the one or more processors to place a battery of an electronic device into a state of expected zero-drain throughout a time interval while the electronic device remains active, and a battery leakage monitor stored in the memory and executable by the one or more processors to detect a battery charge leak based on a series of time-separated parameter measurements for the battery collected during the time interval.

20 Claims, 4 Drawing Sheets

(56) References Cited

U.S. PATENT DOCUMENTS

| | | |
|---|---|---|
| 6,479,962 B2 | 11/2002 | Ziemkowski et al. |
| 7,768,756 B2 | 8/2010 | Huang et al. |
| 8,154,255 B2 | 4/2012 | Wang et al. |
| 8,232,771 B2 | 7/2012 | Johnson et al. |
| 9,166,423 B2 | 10/2015 | Kim et al. |
| 9,438,054 B2 | 9/2016 | Patel et al. |
| 9,596,005 B2 | 3/2017 | Kurs et al. |
| 2012/0229142 A1* | 9/2012 | Yang .................. G01R 31/36 324/426 |
| 2013/0241494 A1* | 9/2013 | Bhardwaj ............ G01R 31/389 320/129 |
| 2016/0064961 A1* | 3/2016 | DiCarlo ................ H02J 7/007 320/157 |
| 2019/0324086 A1* | 10/2019 | Yu ........................ H01M 10/48 |

\* cited by examiner

BATTERY CHARGE LEAKAGE MONITOR

BACKGROUND

Some types of batteries are prone to unintended current leakage due to a phenomenon known as dendrite growth or lithium metal plating. When this phenomenon occurs, the battery may fail and, in rare cases, pose a danger to a user such as due to a risk of combustibility. Although the ability to detect early dendrite growth could reduce a number of battery failures that occur as a result of this fault, it is for various reasons challenging to monitor for battery charge leakage in an electronic device without disrupting the user experience.

SUMMARY

According to one implementation, a system includes system power throttle and a battery leakage monitor stored in memory. The system power throttle is executable to place a battery of an electronic device into a state of expected zero-drain throughout a time interval and the battery leakage monitor is executable to detect a battery charge leak based on a series of time-separated parameter measurements for the battery collected during the time interval.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

DETAILED DESCRIPTION

Traditionally, testing for battery leakage is performed by removing a battery from its associated device and physically testing the battery. Removing the battery from device circuitry prevents the battery from charging and discharging to support variable system loads, thereby facilitating an isolated measurement of unintended current drain (e.g., battery leakage). In devices such as laptops, tablets, and mobile phones, battery removal and testing is burdensome to users; consequently, mobile device batteries are rarely tested for current leakage.

As a device battery ages over time, the battery may hold charge for shorter and shorter time periods until a user is finally motivated to take the electronic device in for servicing and/or battery replacement. However, certain types of battery leakage—particularly, leakage from lithium-ion batteries—can in rare cases pose a danger, especially if the user remains unaware of a potential battery defect until failure occurs. The herein disclosed technology provides solutions for non-invasive battery charge leakage monitoring and detection before battery failure occurs. According to one implementation, this monitoring is performed while the battery is in use in-the-field and without disconnecting the battery from the system load source. Monitoring battery leakage in this way facilitates a variety of optional preventative measures, such as pre-emptive user notification and/or automated measures to keep the battery safe (e.g., by limiting charge and discharge) until the battery can be replaced.

Figure 1:
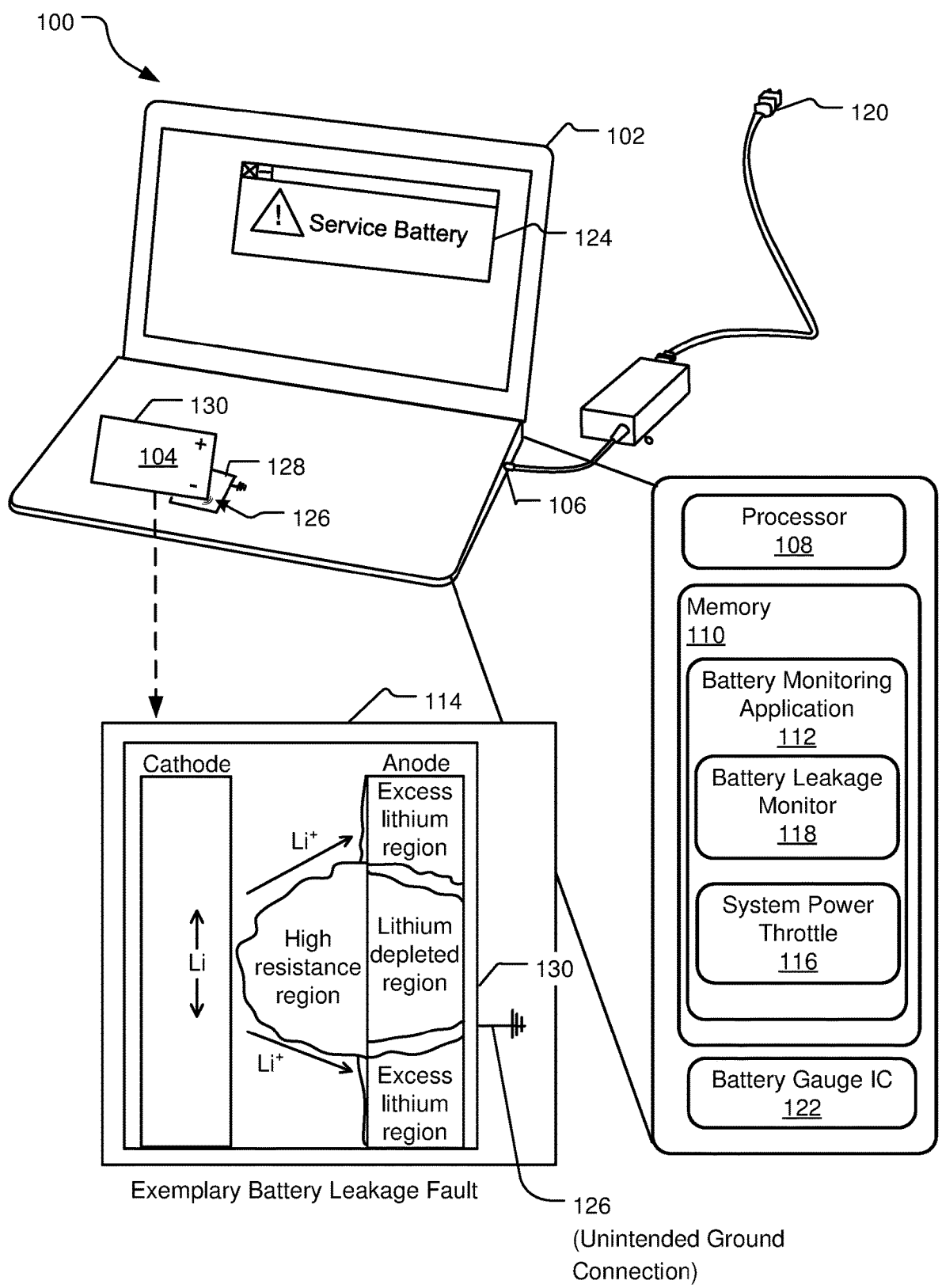
FIG. 1 illustrates an example system for battery charge leakage monitoring and detection.

FIG. 1 illustrates an example system 100 for battery charge leakage monitoring and detection. The system 100 includes a processing device 102 with a battery 104 that is charged by an external power supply unit (PSU) (not shown) through a device charging port 106. The processing device 102 includes a processor 108 and memory 110 storing various applications, including a battery monitoring application 112. The battery monitoring application 112 performs various operations to non-invasively monitor the battery 104 for current leakage.

View 114 of FIG. 1 illustrates the interior of a battery cell interior exhibiting a fault known as dendrite growth within a lithium-ion battery. If undetected, severe dendrite growth can cause a number of problems including eventual battery failure. Dendrite growth can begin to occur when there exists an unintentional grounding of a portion of the battery 104.

For example, the battery 104 may have an outer aluminum pouch 130 or other metal casing that is intended by design to be electrically floating relative to other electrical components. However, the outer aluminum pouch 130 may contact an electrical ground as a result of initial manufacturing variations or shifting of components during use, creating an unintended ground connection 126. For example, the unintended ground connection 126 may be created when outer aluminum pouch 130 contacts a portion of a printed circuit board ground plane 128 after the processing device 102 is dropped or subjected to various physical impacts. Once the battery 104 is grounded is this manner, lithium ions carry positive charge through the electrolyte of the battery cell to the aluminum pouch 130 and to the unintended ground source 126. This transfer of charge is balanced by electrons carrying negative charge flowing through the unintended ground connection 126. This dendrite growth causes a number of issues, including corrosion and swelling of the affected battery cell, gradually discharging the battery and reducing energy storage capacity, unbalancing the state of charge on the different cells in the stack.

In different implementations, the battery 104 may have different properties. For example, the battery 104 may have a 1S packs such as a 3-4.4 V pack, or a 2S pack, such as 6V-8.8V packs. In general, the illustrated fault is more likely to occur in a multi-cell pack when the cell with the grounded aluminum is one of the higher voltage cells in a series pack configuration.

If the battery cell aluminum pouch 130 is connected to ground, this could lead to dendrite growth which can cause a non-zero drain state. In order to test for the fault scenario illustrated in the view 114, the battery monitoring application 112 periodically performs operations to place the battery 104 into a state of expected zero-drain, effectively isolating the battery 104 from system load electronics (not shown) during a period of time during in which various parameters of the battery 104 can be measured and detected. As used herein an "expected zero-drain state" is a state where the battery 104 is effectively isolated from the system load electronics in that the battery 104 is not charging and is not expected to discharge current unless the battery 104 is leaking current.

Power circuitry (not shown) of the processing device 102 is designed to utilize the external PSU through a plug connection 120 as a primary power source whenever a coupling is detected between the external PSU and the device charging port 106. When power demands of the system load are less than the current flow into the processing device 102 through the device charging port 106, the battery 104 does not discharge unless the battery 104 is leaking (an unintentional discharge). When power demands of the system load electronics increase to a rate that exceeds a rate of current flow into the processing device 102, current is selectively discharged from the battery 104 to support the system load electronics. As a result of this configuration, the processing device 102 may remain active (e.g., performing various processing tasks) while the battery 104 is in a zero-drain state provided that external PSU is connected and large enough to independently support system loads.

The battery monitoring application 112 includes a system power throttle 116 that leverages this power circuitry design to selectively isolate the battery 104 from the system load electronics when the battery monitoring application 112 initiates a battery parameter measurement sequence. Responsive to initiation of such a sequence, the system power throttle 116 controls the system load electronics to reduce a total system power demands by an amount sufficient to place the battery 104 into a state of expected zero-drain.

In one implementation, the system power throttle 116 places the battery 104 into a state of expected zero-drain by transmitting control signals to various components within the system load electronics that alter a power configuration to reduce total power demand, such as by temporarily halting some or all CPU activity, turning off certain device components (e.g., turning of various device ports, such as USB), disconnecting Wi-Fi, etc.

While the battery 104 is in the expected zero-drain state, a battery leakage monitor 118 obtains one or more real-time parameter measurements from battery gauge integrated circuitry (IC) 122. The battery gauge IC 122 includes at least a current monitor, such as a Coulomb counter capable of measuring small currents (e.g., in the range of a few micro amps).

In one implementation, the battery gauge IC 122 is internal to a battery pack of the battery 104 and includes circuitry for measuring various parameters such as voltage, charge state, current discharge/charge rates, and temperature. The battery gauge IC 122 may include a microprocessor (not shown) for reading battery parameter measurements and reporting such measurements to other system components such as, for example, the battery leakage monitor 118. For example, the battery gauge IC 122 may transmit battery parameters to the battery leakage monitor 118 in response to a request (e.g., when the system power throttle 116 has placed the battery 104 into the expected zero-drain state) or independently without waiting for a specific request for such information. The battery leakage monitor 118 processes the battery parameter values from the battery gauge IC 122 and determines whether such values are indicative of a battery charge leak.

In one implementation, the battery monitoring application 112 is executed locally on the processing device 102 by the processor 108. In another implementation, aspects of the battery monitoring application 112 are executed by processor external to the processing device 102, such as by one or more processors located at remote processing facilities.

In the event that a battery charge leak is detected, the battery monitoring application 112 may, in some applications, implement a remedial action, such as by displaying a notification 124 (e.g., an notification presented on a display that instructs a user to get the processing device 102 or battery 104 serviced) or by altering device settings to reduce a maximum charge and discharge of the battery 104 and thereby reduce a likelihood of battery failure in a manner that is dangerous to the user. In yet another implementation, the battery monitoring application 112 enters a data lock mode, effectively disabling the processing device 102 and preventing the user from accessing data on the processing device until the battery is serviced (so as to encourage expedited user action).

Figure 2:
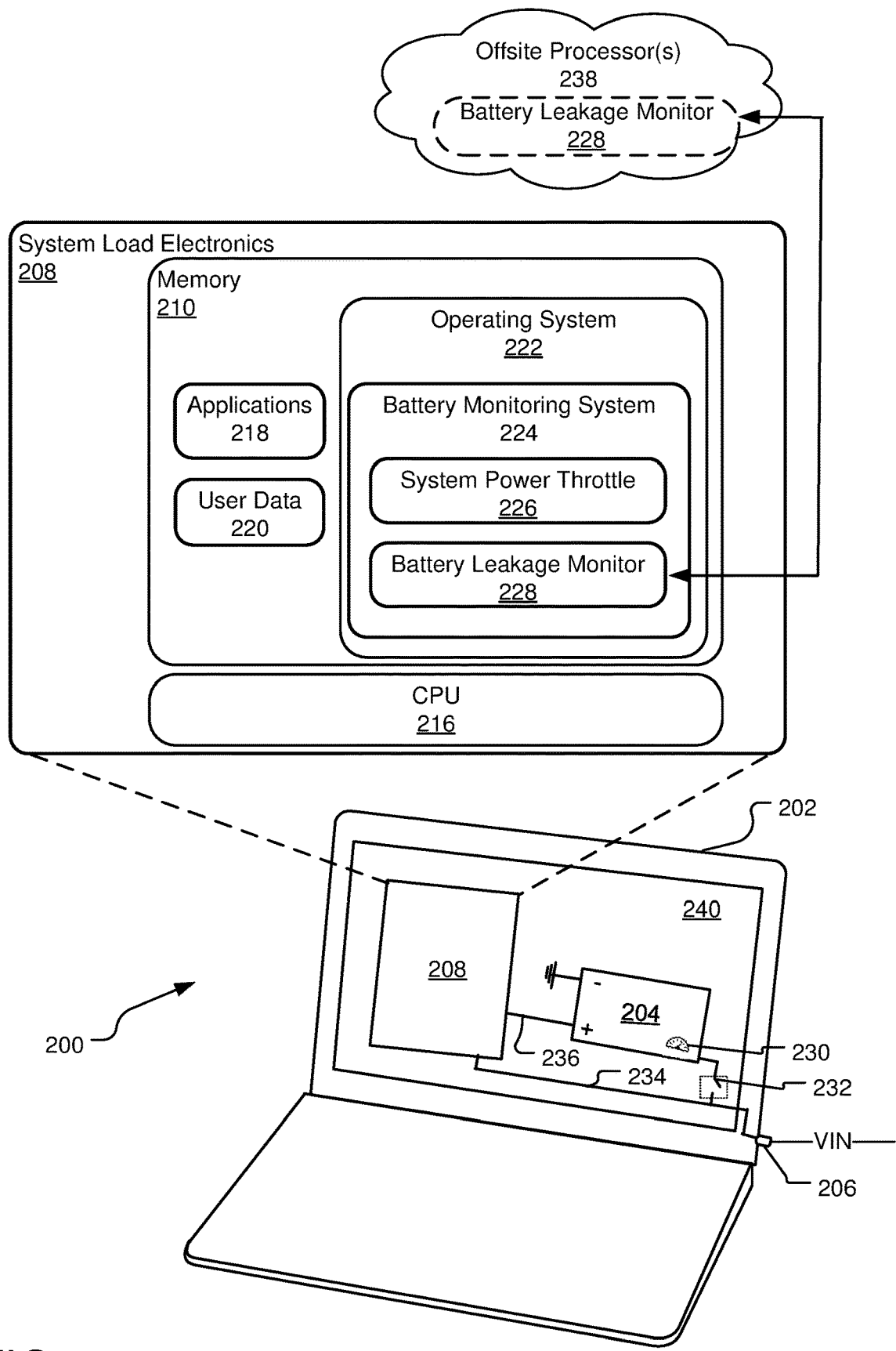
FIG. 2 illustrates another example system for battery charge leakage monitoring and detection.

FIG. 2 illustrates another example system 200 for battery charge leakage monitoring and detection. The system 200 includes an electronic device 202 with a battery 204 that is charged by an external PSU (represented by "VIN") through a charging port 206. The electronic device 202 is shown to be a laptop computer but may, in other implementations, be any type of mobile processing device including without limitation a mobile phone, tablet, or battery-operated device accessory.

The electronic device 202 includes system load electronics 208 including various hardware components (e.g., memory 210 and one or more processor(s), such as a central processing unit (CPU) 216.) The memory 210 may include both volatile memory and/or non-volatile memory for storing device data (e.g., user data 220) and software, such as an operating system 222 and various applications 218. The operating system 222 is shown to include a battery monitoring system 224. In various implementations, the battery monitoring system 224 may include a combination of both hardware and software. In at least one implementation, however, the battery monitoring system 224 is implemented as software that is loaded into the memory 210, such as in the form of an update to the operating system 222, without utilizing any specialized hardware specifically adapted for battery monitoring or current leak detection.

When the charging port 206 is coupled to the external PSU, the external PSU acts as a primary power source for the system load electronics 208, supplying power along a PSU power path 234. During normal use, the system load electronics 208 generate variable load transients that may, at times, consume power at a rate that exceeds a rate of current flow from the external PSU along the PSU power path 234. At such times when the external PSU is alone insufficient to support the system load electronics 208, the battery 204 is selectively discharged along a battery discharge path 236 to supplement the current that is supplied to the system load electronics 208 along the PSU power path 234. Alternatively, when the system load electronics 208 draw less current than that provided along the PSU power path 234, the external power supply charges the battery 204 along a battery charge path 232. In FIG. 2, the battery charge path 232 is shown to include a switch to indicate that the flow of charge into the battery 204 can be selectively enabled and disabled by firmware of the electronic device 202.

Since the power demand of the system load electronics 208 frequently varies above and below the rate of current flow through the charging port 206, the battery 204 toggles between states of charge and discharge during normal use and does not predictably remain in a zero-drain state for any set period of time while the electronic device 202 is active and coupled to the external PSU. To check for battery charge leakage, the battery monitoring system 224 takes actions to forcibly place the battery 204 into an expected zero-drain state during a period of time in which parameters of the battery 204 are sampled in real-time.

The battery monitoring system 224 includes a system power throttle 226 that selectively alters power configuration of the electronic device 202 to place the battery 204 into the expected zero-drain state. In different implementations, the system power throttle 226 may alter the power configuration in different ways. In one implementation, the system power throttle 226 alters the power configuration by disabling (e.g., disconnecting) the battery charge path 232 and the battery discharge path 236. In other implementations, however, the system power throttle 226 disables the battery charge path 232 but alters the power configuration in a manner that leaves the battery discharge path 236 enabled.

In either of the above cases, the system power throttle 226 implements actions to temporarily reduce system power demands, thereby ensuring that the external power supply can independently support the system load electronics 208 so long as the battery 204 remains in the expected zero-drain state.

In different implementations, the system power throttle 226 may selectively place the battery 204 into the expected zero-drain state at different points in time, such as in response to different activities performed the electronic device 202 and/or different events detected at the electronic device 202. To least-impact the user experience, such actions may be selectively performed at times when a forced system lower-power state does not impact a user's experience (e.g., there is no disruption to a user's current login session with the electronic device). In one implementation, the system power throttle 226 places the battery 204 into the expected zero-drain state during a device power down sequence initiated by the operating system 222, such as when the electronic device 202 is transitioning to an "off" (no power) state or when the electronic device 202 is transitioning between a normal power mode and a low-power mode. For example, the operating system 222 may execute a function call to the battery monitoring system 224 when the electronic device 202 is transitioning into a sleep mode or shutting down.

In one implementation, the system power throttle 226 waits for the operating system 222 to turn off a display 240 of the electronic device 202, such as after the display 240 goes "dark" (either having no illuminated pixels at all or pixels that are illuminated in a low-brightness pixel mode). For example, the system power throttle 226 may elect to implement power throttle actions during a power-mode transition sequence after the display 240 is turned off but before the CPU 216 actually enters a sleep or off mode, such as while some of the applications 218 (e.g., mobile device applications such as email, VoIP, social networking, instant messaging) are still active.

The system power throttle 226 transmits control commands instructing system firmware to disable the battery charge path 232 and performs a check to ensure that the external PSU is coupled to the electronic device 202. Provided the external PSU is detected, system power throttle 226 performs power throttle actions to controllably reduce a maximum load transient of the system load electronics 208 to at or below a fixed threshold for a set time period while measurements of one or more battery parameters can be determined. In one implementation, this fixed load transient maximum is small enough that the maximum load transient can be independently supported by the external power supply (e.g., VIN) without a risk of system brown-out. So long as the power consumption rate of the electronic device 202 is capped by the fixed maximum load transient, the battery 204 can remain electrically connected to the system load electronics 208 within discharging along the battery discharge path 236.

In different implementations, the system power throttle 226 reduces the maximum load transient in different ways. In one implementation, the system power throttle 226 transmits control signals that effectively halt, postpone, or otherwise reduce power demand of the CPU 216. For example, the system power throttle 226 may reduce power limits of the CPU 216, causing CPU 216 to independently adjust task execution to ensure that current tasks do not consume more than the adjusted (lower) power limits. In one implementation, the system power throttle 226 lowers limits by an amount that reduce a cap on peak processor power demand but without causing a significant (e.g., user-detectable) delay in wake-up time of the electronic device, such as if a user takes an action to transition the electronic device 202 back into a full-power mode before the battery monitoring system 224 has completed battery parameter measurements. In still other implementations, the system power throttle 226 reduces the maximum load transient in other ways, such as by turning off one or more device components. For example, the system power throttle 226 may disconnect one or more device ports (e.g., Ethernet, USB), halt outbound charging, such as charging of attached accessories, or turn-off one or more indicator lights. In another implementation, the system power throttle 226 disconnects Wi-Fi.

During the period of time in which the battery 204 remains in the expected zero-drain state, the battery leakage monitor 228 requests a series of battery parameter measurements from a battery gauge IC 230 of the battery 204. In one implementation, the battery gauge IC 230 is integrated within a battery pack of the battery 204 and includes sensors for measuring one or more battery parameters (e.g., one or more of voltage, charge state, current discharge/charge rates, and temperature). The battery gauge IC 230 includes a microprocessor (not shown) for reporting battery parameter measurements to other system components such as, for example, the battery leakage monitor 228. For example, the microprocessor of the battery gauge IC 230 may be included within the battery pack or located on a motherboard of the electronic device 202 and operable to collect measurements from the battery gauge IC 230.

In one implementation, the battery leakage monitor 228 determines a series of time-separated current or voltage measurements from the battery gauge IC 230. For example, one current measurement may be collected every 10 seconds for a period of time, such as 90 seconds. Collecting of a series of current measurements from the battery 204 allows the battery leakage monitor 228 to identify and discard individual bad data points, thereby ensuring accuracy of leak detection.

In one implementation, the battery leakage monitor 228 locally processes the battery parameter values (e.g., current or voltage values) obtained from the battery gauge IC 230. In other implementations, aspects of the battery leakage monitor 228 are executed by one or more offsite processor(s) 238, in which case the battery parameter values are transmitted over a network (e.g., the Internet) and processed at a remote location. In either case, the battery leakage monitor 228 determines whether the obtained battery parameter values satisfy current leakage criteria, such as by assessing whether the obtained values are within expected limits associated with current leakage as a result of dendrite growth.

Notably, the above-described battery parameter measurements may be usable to detect unexpected and low level current drains from the battery 204 resulting from a variety of different specific fault scenarios. Current leakage criteria may be set to enable identification of leaks attributable to dendrite growth and/or leaks resulting from other causes.

In one implementation, the battery leakage monitor 228 determines the current leakage criteria are satisfied when the battery parameter measurements are within limits indicative of a small current drain likely to be observed as a result of dendrite growth (e.g., a negative current greater than about 3-10 mA). Conversely, the battery leakage monitor 228 may determine that the current leakage criteria are not satisfied when the series of battery parameter measurements are indicative of a comparatively large current drain, such as may be the case when the electronic device 202 is coupled to a non-compatible charger or weak external PSU.

Responsive to identification of a battery charge leak, the battery leakage monitor 228 may take one or more actions, depending on factors such as the severity of the detected leak, known risk associated with the specific type of battery pack(s) included in the electronic device 202, or other factors. In one implementation where the battery leakage monitor 228 is executed in-part by the offsite processor(s) 238, the battery leakage monitor 228 creates an electronic record of the detected current leak, such as by recording a device serial number or other information identifying the device or a device user. For instance, a manufacturer of the electronic device 202 may contact a user of the electronic device to inform the user of the defect, such as by utilizing contact information (e.g., phone, address, email) that the user provided when initially registering the electronic device 202 with a manufacturer. In an implementation where the battery leakage monitor 228 is executed locally and/or without an internet connection, the battery leakage monitor 228 may create a local record of the potential battery defect, such as a record that can be accessed by a technician that subsequently services the electronic device 202.

In still another implementation, the battery leakage monitor 228 generates and displays a notification to inform a user of a detected battery problem and/or to recommend that the user take the electronic device 202 to a specialist to replace the battery 204. In yet another implementation, the battery leakage monitor 228 alters other settings of the electronic device 202 responsive to detection of a battery charge leak. For example, the battery monitoring system 224 may reduce maximum charge and discharge rates of the battery 104, thereby mitigating a likelihood of dangerous battery failure (e.g., combustion). In still another implementation, the battery leakage monitor 228 responds to detection of a battery leak by disabling the electronic device 202, such as by placing the electronic device 202 into a data lock mode, so as to prevent a user from accessing some or all data on the electronic device 202 until the battery 204 is serviced.

Figure 3:
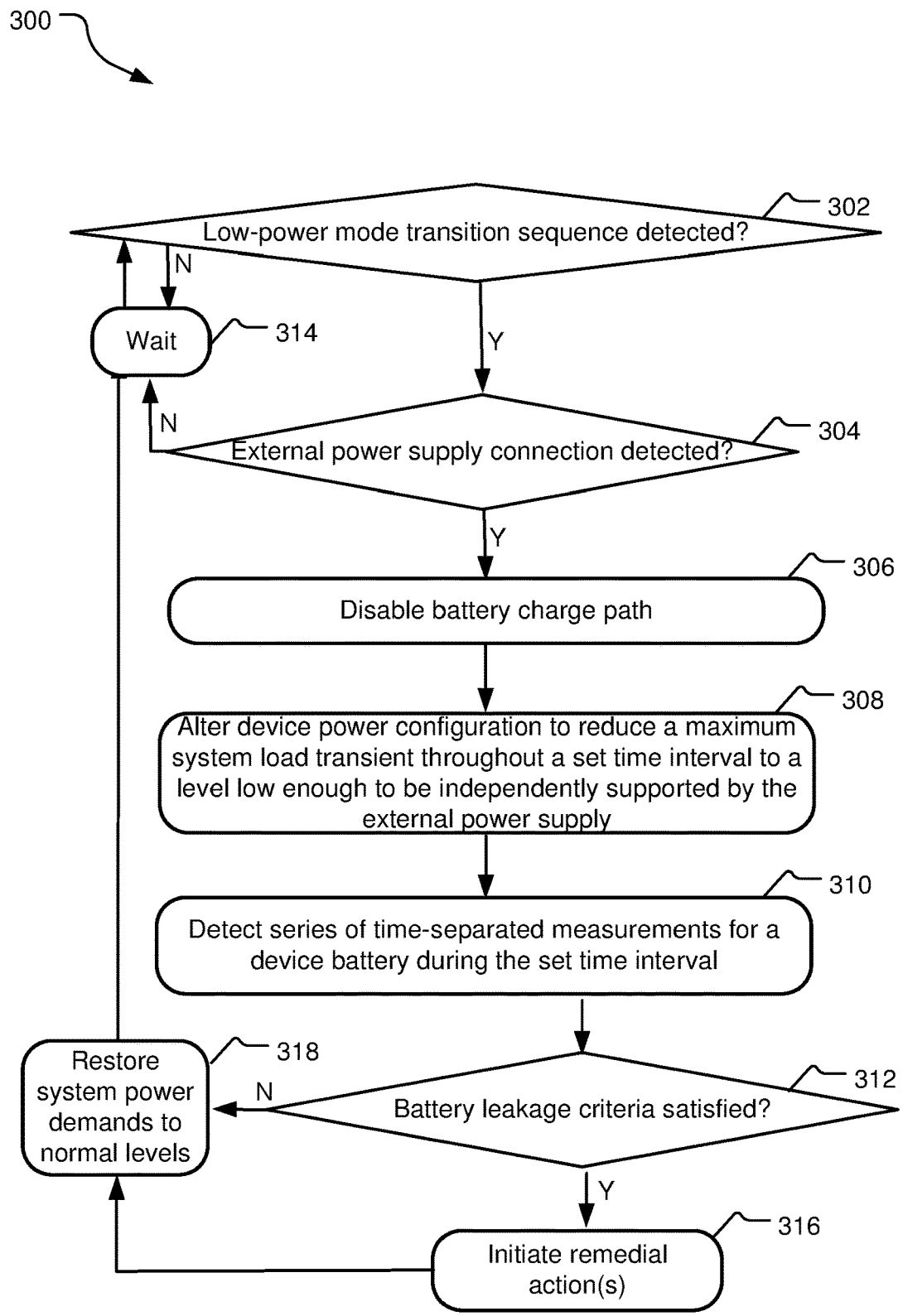
FIG. 3 illustrates example operations for detecting a battery leak in an electronic device without disconnecting the battery or disrupting the user experience.

FIG. 3 illustrates example operations 300 for detecting a battery charge leak in an electronic device without disconnecting the battery or disrupting the user experience. A determination operation 302 determines whether a low-power mode transition sequence has been initiated by a device operating system, such as a sequence to place the electronic device into a sleep or standby mode. Responsive to detecting the initiation of the low-power mode transition sequence, another determination operation 304 determines whether an external power supply is coupled to a charging port of the electronic device. If the determination operation 302 determines that the power mode transition sequence has not yet initiated or the determination operation 304 determines that the external power supply is not connected, a waiting operation 314 is assumed.

Responsive to detecting the connection to the external power supply, a battery charge disabling operation 306 disables a charge path to the battery, and a power throttle operation 308 alters a device power configuration to reduce a maximum system load transient throughout a set time interval to a level low enough to be independently supported by the external power supply. In one implementation, the power throttle operation 308 alters the device power configuration by reducing power limits of a CPU. In other implementations, the power throttle operation 308 reduces system power demands in other ways, such as by disconnecting one or more components (e.g., disabling USB, Ethernet, Wi-Fi, accessory changing, etc.)

A detection operation 310 detects a series of time-separated measurements for a device battery during the set time interval while the maximum system load transient is reduced, such as current or voltage measurements taken at controlled time intervals. In one implementation, the time-separated measurements are collected by a battery gauge in the battery pack.

A determination operation 312 determines whether the detected battery parameter measurements satisfy battery leakage criteria. If the battery leakage criteria are not satisfied, a power restore operation 318 reverses the power throttle operation 308, restoring system power demands to normal levels for the associated device mode, and the waiting operation 314 is resumed until initiation of the next low-power transition mode sequence.

If the determination operation 312 determines that the detected battery parameter measurements do satisfy current leakage criteria, a remedial action operation 316 initiates one or more remedial actions including without limitation the example remedial actions described above with respect to FIGS. 1 and 2. The power restore operation 318 reverses the power throttle operation 308, and the waiting operation 314 is resumed until initiation of the next low-power transition mode sequence.

Figure 4:
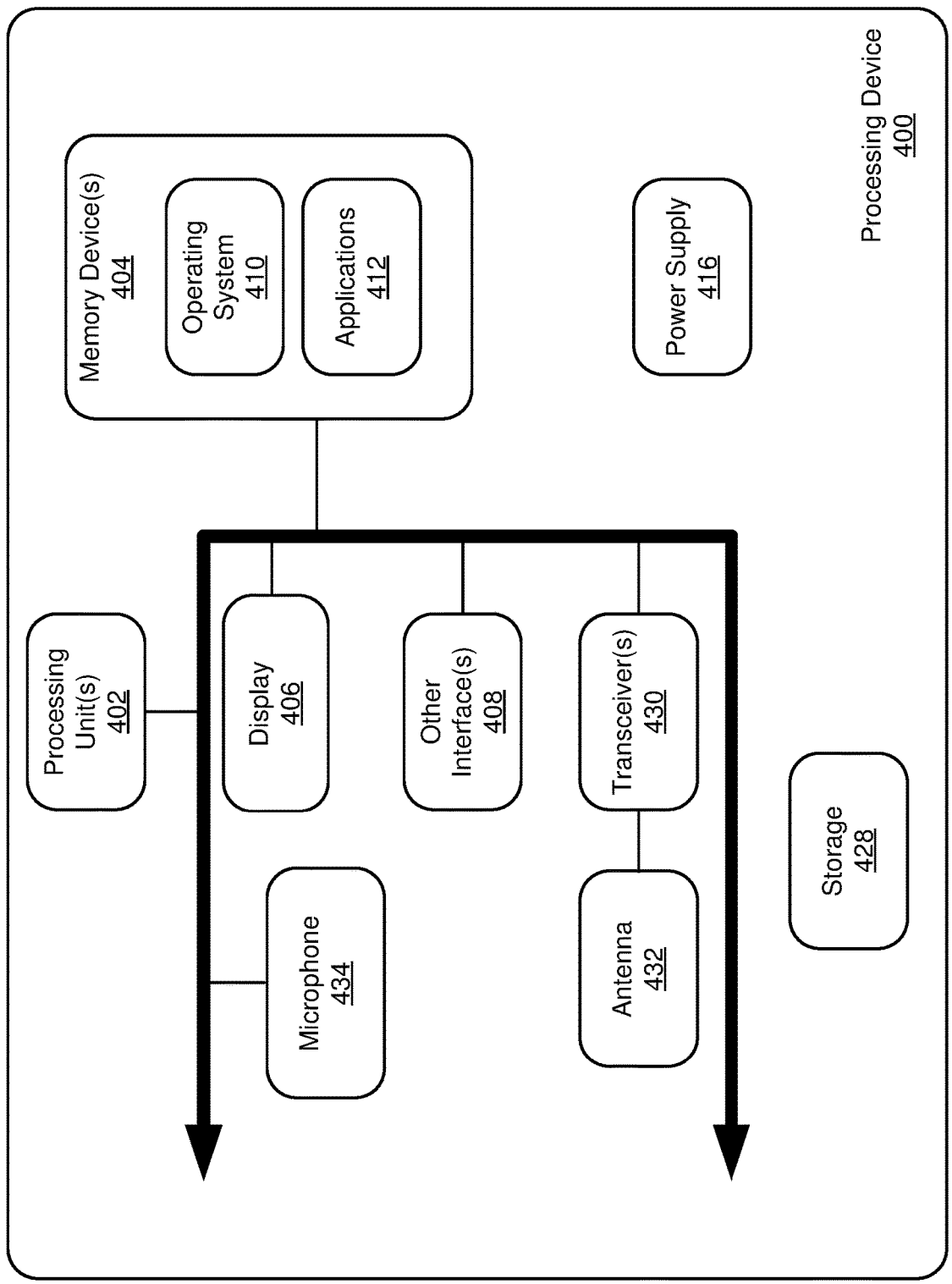
FIG. 4 illustrates an example schematic of a processing device suitable for implementing aspects of the disclosed technology.

FIG. 4 illustrates an example schematic of a processing device 400 suitable for implementing aspects of the disclosed technology. In various implementations, the processing device 400 may represent any one or more of a broadcasting device, spectating device, game controller, or game execution device. The processing device 400 includes one or more processor unit(s) 402, memory 404, a display 406, and other interfaces 408. The memory 504 generally includes both volatile memory (e.g., RAM) and non-volatile memory (e.g., flash memory). An operating system 410, such as the Microsoft Windows® operating system, the Microsoft Windows® Phone operating system or a specific operating system designed for a gaming device, resides in the memory 404 and is executed by the processor unit(s) 402, although it should be understood that other operating systems may be employed.

One or more applications 412, such as the battery monitoring application 112 of FIG. 1, are loaded in the memory 404 and executed on the operating system 410 by the processor unit(s) 402. The applications 412 may receive input from various input devices such as a microphone 434 or input accessory 435 (e.g., keypad, mouse, stylus, touchpad, gamepad, racing wheel, joystick). The processing device 400 includes a power supply 416, which is powered by one or more batteries or other power sources and which provides power to other components of the processing device 400. The power supply 416 may also be connected to an external power source that overrides or recharges the built-in batteries or other power sources.

The processing device 400 includes one or more communication transceivers 430 and an antenna 432 to provide network connectivity (e.g., a mobile phone network, Wi-Fi®, Bluetooth®). The processing device 400 may also include various other components, such as a positioning system (e.g., a global positioning satellite transceiver), one or more accelerometers, one or more cameras, an audio interface (e.g., a microphone 434, an audio amplifier and speaker and/or audio jack), and storage devices 428. Other configurations may also be employed.

In an example implementation, a mobile operating system, various applications (e.g., a battery monitoring application), modules, and services may have hardware and/or software embodied by instructions stored in memory 404 and/or storage devices 428 and processed by the processor unit(s) 402. The memory 404 may be memory of host device or of an accessory that couples to a host.

The processing device 400 may include a variety of tangible computer-readable storage media and intangible computer-readable communication signals. Tangible computer-readable storage can be embodied by any available media that can be accessed by the processing device 400 and includes both volatile and nonvolatile storage media, removable and non-removable storage media. Tangible computer-readable storage media excludes intangible and transitory communications signals and includes volatile and nonvolatile, removable and non-removable storage media implemented in any method or technology for storage of information such as computer readable instructions, data structures, program modules or other data. Tangible computer-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information, and which can be accessed by the processing device 400. In contrast to tangible computer-readable storage media, intangible computer-readable communication signals may embody computer readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include wired media such as a wired network or direct-wired connection, and wireless media such as acoustic, RF, infrared and other wireless media.

Some embodiments may comprise an article of manufacture. An article of manufacture may comprise a tangible storage medium to store logic. Examples of a storage medium may include one or more types of computer-readable storage media capable of storing electronic data, including volatile memory or non-volatile memory, removable or non-removable memory, erasable or non-erasable memory, writeable or re-writeable memory, and so forth. Examples of the logic may include various software elements, such as software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. In one embodiment, for example, an article of manufacture may store executable computer program instructions that, when executed by a computer, cause the computer to perform methods and/or operations in accordance with the described embodiments. The executable computer program instructions may include any suitable type of code, such as source code, compiled code, interpreted code, executable code, static code, dynamic code, and the like. The executable computer program instructions may be implemented according to a predefined computer language, manner or syntax, for instructing a computer to perform a certain function. The instructions may be implemented using any suitable high-level, low-level, object-oriented, visual, compiled and/or interpreted programming language.

According to one implementation, an example system disclosed herein includes a system power throttle and a battery leakage monitor stored in memory and executable by the one or more processors. The system power throttle places a battery within an electronic device into a state of expected zero-drain throughout a time interval while the electronic device remains active, and the battery leakage monitor detects a battery charge leak based on a series of time-separated parameter measurements for the battery collected during the time interval without impacting a use session of the electronic device.

In another example system of any preceding system, the system power throttle places the battery into the state of expected zero-drain by disabling a battery charge path and reducing a maximum system load transient of an electronic device during the time interval, the maximum system load transient being small enough to permit independent support of the electronic device by an external power supply.

In yet another example system of any preceding system, the system power throttle is further configured to limit the maximum system load transient during a power mode transition sequence of the electronic device.

In still another example system of any preceding system, the system power throttle places the battery into the state of expected zero-drain without disconnecting a battery discharge path from system load electronics.

In yet another example system of any preceding system, the system further includes a battery gauge coupled to the battery and configured to collect the series of time-separated parameter measurements and to transmit the series of time-separated parameter measurements to the battery leakage monitor.

In yet another example system of any preceding system, the battery leakage monitor is further executable to implement a remedial action responsive to detection of the battery charge leak.

In still another example system of any preceding system, the remedial action includes limiting current flow to and from the battery to a reduced level.

In another example system of any preceding system, the remedial action includes notifying a user of a potential battery problem.

In another example system of any preceding system, the remedial action includes disabling the electronic device.

An example method disclosed herein includes altering a device power configuration with a processor to place a battery within an electronic device into a state of expected zero-drain throughout a time interval while the electronic device remains active; and detecting a battery charge leak based on a series of time-separated parameter measurements for the battery collected during the time interval.

In an example method of any preceding method, the device power configuration includes disabling a battery charge path and reducing a maximum system load transient of an electronic device during the time interval, the maximum system load transient being small enough to permit independent support of the electronic device by an external power supply.

In yet another example method of any preceding method, the time interval is during a power mode transition sequence of the electronic device.

In still another example method of any preceding method, the battery remains connected to system load electronics while in the state of expected zero-drain.

In yet another example method of any preceding method, the method further includes implementing a remedial action responsive to detection of the battery charge leak.

In yet another example method of any preceding method, the remedial action includes disabling the electronic device.

An example computer-readable storage media of a tangible article of manufacture disclosed herein encodes computer-executable instructions for executing a computer process comprising: altering a device power configuration to place a battery within an electronic device into a state of expected zero-drain throughout a time interval while the electronic device remains active; and detecting a battery charge leak based on a series of time-separated parameter measurements for the battery collected during the time interval.

In another example computer process of any preceding computer process encoded on a computer-readable storage media, the encoded computer process further includes disabling a battery charge path and reducing a maximum system load transient of an electronic device during the time interval, the maximum system load transient being small enough to permit independent support of the electronic device by an external power supply.

In another example computer process of any preceding computer process encoded on a computer-readable storage media, the time interval is during a power mode transition sequence of the electronic device.

In still another example computer-readable storage media of any preceding computer-readable storage media, the battery remains connected to system load electronics while in the state of expected zero-drain.

In still another example computer process of any preceding computer process encoded on a computer-readable storage media, the computer process further comprises implementing a remedial action responsive to detection of the battery charge leak.

The above specification, examples, and data provide a complete description of the structure and use of exemplary implementations. Since many implementations can be made without departing from the spirit and scope of the claimed invention, the claims hereinafter appended define the invention. Furthermore, structural features of the different examples may be combined in yet another implementation without departing from the recited claims.

What is claimed is:

1. A system comprising:
   memory;
   one or more processors;
   a system power throttle stored in memory and executable by the one or more processors to:
   initiate a battery leakage test by taking one or more actions to place a battery within an electronic device into a state of expected zero-drain, the one or more actions including transmitting one or more control signals effective to controllably reduce a maximum load transient of system electronics to at or below a defined threshold throughout a time interval while the electronic device remains active; and
   a battery leakage monitor stored in the memory and executable by the one or more processors to detect a battery charge leak based on a series of time-separated parameter measurements for the battery collected during the time interval without impacting a use session of the electronic device.

2. The system of claim 1, wherein the one or more actions further include disabling a battery charge path of the electronic device during the time interval, the maximum system load transient being small enough to permit independent support of the electronic device by an external power supply.

3. The system of claim 2, wherein the system power throttle is further configured to limit the maximum system load transient during a power mode transition sequence of the electronic device.

4. The system of claim 1, wherein the system power throttle places the battery into the state of expected zero-drain without disconnecting a battery discharge path from system load electronics.

5. The system of claim 1, further comprising:
   a battery gauge coupled to the battery and configured to collect the series of time-separated parameter measurements and to transmit the series of time-separated parameter measurements to the battery leakage monitor.

6. The system of claim 1, wherein the battery leakage monitor is further executable to implement a remedial action responsive to detection of the battery charge leak.

7. The system of claim 6, wherein the remedial action includes limiting current flow to and from the battery to a reduced level.

8. The system of claim 6, wherein the remedial action includes notifying a user of a potential battery problem.

9. The system of claim 6, wherein the remedial action includes disabling the electronic device.

10. A method comprising:
    initiating a battery leakage test by taking one or more actions to place a battery within an electronic device into a state of expected zero-drain, the one or more actions including transmitting one or more control signals effective to controllably reduce a maximum load transient of system electronics to at or below a defined threshold throughout a time interval while the electronic device remains active; and
    detecting a battery charge leak based on a series of time-separated parameter measurements for the battery collected during the time interval.

11. The method of claim 10, wherein transmitting the one or more control signals includes transmitting a control signal to disable a battery charge path of the electronic device during the time interval, the maximum system load transient being small enough to permit independent support of the electronic device by an external power supply.

12. The method of claim 10, wherein the time interval is during a power mode transition sequence of the electronic device.

13. The method of claim 10, wherein the battery remains connected to system load electronics while in the state of expected zero-drain.

14. The method of claim 10, further comprising:
implementing a remedial action responsive to detection of the battery charge leak.

15. The method of claim 14, wherein the remedial action includes disabling the electronic device.

16. One or more tangible computer-readable storage media of a tangible article of manufacture encoding computer-executable instructions for executing on a computer system a computer process, the computer process comprising:
initiating a battery leakage test by taking one or more actions to place a battery within an electronic device into a state of expected zero-drain, the one or more actions including transmitting one or more control signals effective to controllably reduce a maximum load transient of system electronics to at or below a defined threshold throughout a time interval while the electronic device remains active; and
detecting a battery charge leak based on a series of time-separated parameter measurements for the battery collected during the time interval.

17. The one or more tangible computer-readable storage media of claim 16, wherein transmitting the one or more control signals includes transmitting a control signal to disable a battery charge path of the electronic device during the time interval, the maximum system load transient being small enough to permit independent support of the electronic device by an external power supply.

18. The one or more tangible computer-readable storage media of claim 16, wherein the time interval is during a power mode transition sequence of the electronic device.

19. The one or more tangible computer-readable storage media of claim 16, wherein the battery remains connected to system load electronics while in the state of expected zero-drain.

20. The one or more tangible computer-readable storage media of claim 16, wherein the computer process further comprises:
implementing a remedial action responsive to detection of the battery charge leak.

\* \* \* \* \*